(12) United States Patent
Branch et al.

(10) Patent No.: US 7,626,850 B2
(45) Date of Patent: Dec. 1, 2009

(54) SYSTEMS AND DEVICES FOR IMPLEMENTING SUB-THRESHOLD MEMORY DEVICES

(75) Inventors: Charles M. Branch, Dallas, TX (US); Steven C. Bartling, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 47 days.

(21) Appl. No.: 11/736,400

(22) Filed: Apr. 17, 2007

(65) Prior Publication Data
US 2008/0259681 A1 Oct. 23, 2008

(51) Int. Cl.
*G11C 11/00* (2006.01)
(52) U.S. Cl. ............... 365/154; 365/156; 365/188; 365/189.05; 365/190; 365/202; 365/181; 365/230.05
(58) Field of Classification Search ............. 365/49.11, 365/154, 156, 188, 189.05, 190, 202, 181, 365/230.05
See application file for complete search history.

(56) References Cited

U.S. PATENT DOCUMENTS

| 6,026,012 A | * | 2/2000 | Hsue ............... 365/154 |
| 6,920,061 B2 | | 7/2005 | Bhavnagarwala et al. |

(Continued)

FOREIGN PATENT DOCUMENTS

| KR | 200077495 Y1 | 7/1993 |
| KR | 100229857 Y1 | 11/1999 |
| KR | 1020050112972 A | 12/2005 |
| KR | 1020060031203 A | 4/2006 |

OTHER PUBLICATIONS

U.S. Appl. No. 11/736,419, filed Apr. 17, 2007, Charles M. Branch.
Commissioner, International Searching Authority, Notification of Transmittal of the International Search Report and the Written Opinion of the International Searching Authority, or the Declaration, date of mailing Sep. 29, 2008, International Application No. PCT/US2008/060581, International Filing Date Apr. 17, 2008.

*Primary Examiner*—Hoai V Ho
*Assistant Examiner*—Fernando N Hidalgo
(74) *Attorney, Agent, or Firm*—John J. Patti; Wade J. Brady, III; Frederick J. Telecky, Jr.

(57) ABSTRACT

Various systems and methods for implementing memory devices are disclosed. For example, some embodiments of the present invention provide sub-threshold memory devices that include a differential bit cell. Such a differential bit cell includes two PMOS transistors, two NMOS transistors, and two inverters. The source of the first PMOS transistor and the source of the second PMOS transistor are electrically coupled to a bit line input, and the source of the first NMOS transistor and the source of the second NMOS transistor are electrically coupled to the bit line input. The gate of the first NMOS transistor and the gate of the second NMOS transistor are electrically coupled to a word line input. The gate of the first PMOS transistor and the gate of the second PMOS transistor are electrically coupled to an inverted version of the word line input. The drain of the first PMOS transistor is electrically coupled to the drain of the first NMOS transistor, and the drain of the second PMOS transistor is electrically coupled to the drain of the second NMOS transistor. In addition, the drain of the first PMOS transistor is electrically coupled to the drain of the second PMOS transistor by the first inverter, and the drain of the second PMOS transistor is electrically coupled to the drain of the first PMOS transistor by the second inverter.

3 Claims, 3 Drawing Sheets

U.S. PATENT DOCUMENTS

| | | | |
|---|---|---|---|
| 7,130,238 B1 * | 10/2006 | Yu et al. | 365/230.05 |
| 2003/0103398 A1 | 6/2003 | Van Tran | |
| 2004/0079978 A1 | 4/2004 | Kang et al. | |
| 2005/0216806 A1 | 9/2005 | Verwegen | |
| 2006/0250880 A1 * | 11/2006 | Ramaraju et al. | 365/230.05 |

* cited by examiner

SYSTEMS AND DEVICES FOR IMPLEMENTING SUB-THRESHOLD MEMORY DEVICES

BACKGROUND OF THE INVENTION

The present invention is related to data storage circuits, and more particularly to Sub-threshold memory devices.

A number of different memory devices have been developed. FIG. 1 shows a typical memory array 100 including a number of bit cells 110 that are each capable of storing one bit of information. Bit cells 110 are read and written after being addressed using a row decoder 120 and a column decoder 130. Row decoder 120 drives a number of word lines 121 and column decoder 130 drives a number of bit lines 131. FIG. 2 provides a detailed drawing of exemplary bit cell 110. Bit cell 110 is driven by word line 121, and the bit line and an inverted version of the bit line (bit_line_b) provide an indication of the data stored in bit cell 110. Bit cell 110 includes two NMOS transistors 210, 220 and two inverters 230, 240. The bit line is electrically coupled to the drain of NMOS transistor 220, and the inverted bit line is electrically coupled to the source of NMOS transistor 210. The drain of NMOS transistor 210 is electrically coupled to the source of NMOS transistor 220 via inverter 230 and inverter 240. Word line 121 is electrically coupled to the gate of transistor 210 and the gate of transistor 220.

In operation, reading and writing bit cell 110 is accomplished using the same port including word line 121 and the two bit lines. Bit cell 110 can be made very small due to the small number of wires accessing the cell. During a read operation, when word line 121 is asserted high, one of the bit line and the inverted bit line is asserted high, and the other is asserted low. These bit line values may each be provided to a sense circuit capable of sensing the value on the particular bit line and providing an output reflecting the detected value. Similar to a read operation, during a write operation one of the bit line or the inverted bit line is asserted high, and the other is asserted low. In this condition, asserting word line 121 high causes the value on the bit lines to be stored in bit cell 110.

The aforementioned approach allows for high density devices due to the very small number of access wires feeding bit cell 110. However, a substantial voltage differential between the power supply and the ground must be maintained in order to assure accurate operation. Further, the operation of bit cell 110 may be substantially impacted by process and environmental variations.

Hence, for at least the aforementioned reasons, there exists a need in the art for advanced systems and devices for implementing memory and register devices.

BRIEF SUMMARY OF THE INVENTION

The present invention is related to data storage circuits, and more particularly to Sub-threshold memory devices.

Various embodiments of the present invention provide sub-threshold memory devices that include a differential bit cell. Such a differential bit cell includes two PMOS transistors, two NMOS transistors, and two inverters. The source of the first PMOS transistor and the source of the second PMOS transistor are electrically coupled to a bit line input, and the source of the first NMOS transistor and the source of the second NMOS transistor are electrically coupled to the bit line input. The gate of the first NMOS transistor and the gate of the second NMOS transistor are electrically coupled to a word line input. The gate of the first PMOS transistor and the gate of the second PMOS transistor are electrically coupled to an inverted version of the word line input. The drain of the first PMOS transistor is electrically coupled to the drain of the first NMOS transistor, and the drain of the second PMOS transistor is electrically coupled to the drain of the second NMOS transistor. In addition, the drain of the first PMOS transistor is electrically coupled to the drain of the second PMOS transistor by the first inverter, and the drain of the second PMOS transistor is electrically coupled to the drain of the first PMOS transistor by the second inverter. In some cases, the bit cell is written and read only when the word line input is asserted high.

In some instances of the aforementioned embodiments, the memory device is a register that includes the aforementioned bit cell. In such cases, the register includes a register output, and a tri-state buffer. An input of the tri-state buffer is electrically coupled to the drain of one of the PMOS transistors, and an output of the tri-state buffer is electrically coupled to the register output.

In some instances of the aforementioned embodiments, the bit line input includes a first bit line and a second bit line. In such cases, the first bit line and the second bit line are available as external inputs to the bit cell. The electrical coupling of the source of the first PMOS transistor and the source of the second PMOS transistor to the bit line input includes an electrical coupling of the first bit line to the source of the first PMOS transistor, and an electrical coupling of the second bit line to the source of the second PMOS transistor. The electrical coupling of the source of the first NMOS transistor and the source of the second NMOS transistor to the bit line input includes an electrical coupling of the first bit line to the source of the first NMOS transistor, and an electrical coupling of the second bit line to the source of the second NMOS transistor. In such a configuration, asserting the first bit line high and asserting the second bit line low when the word line is asserted results in the drain of the first PMOS transistor being asserted low relative to the drain of the second PMOS transistor. In contrast, where the first bit line is asserted low and the second bit line is asserted high, the drain of the first PMOS transistor is asserted high relative to the drain of the second PMOS transistor. In some cases, a differential output is available from the bit cell with one side of the differential output being driven by the drain of the first PMOS transistor and the other side of the differential output being driven by the drain of the second PMOS transistor.

In other instances of the aforementioned embodiments, the bit line input includes four distinct lines that are each available external to the bit cell: a first bit line, a second bit line, a third bit line, and a fourth bit line. The electrical coupling of the source of the first PMOS transistor and the source of the second PMOS transistor to the bit line input includes an electrical coupling of the first bit line to the source of the first PMOS transistor, and an electrical coupling of the second bit line to the source of the second PMOS transistor. The electrical coupling of the source of the first NMOS transistor and the source of the second NMOS transistor to the bit line input includes an electrical coupling of the third bit line to the source of the first NMOS transistor, and an electrical coupling of the fourth bit line to the source of the second NMOS transistor. In such a configuration, asserting the first bit line high, asserting the second bit line low, asserting the third bit line high, and asserting the fourth bit line low when the word line is asserted results in the drain of the first PMOS transistor being asserted low relative to the drain of the second PMOS transistor. In contrast, where the first bit line is asserted low, the second bit line is asserted high, the third bit line is asserted low, and the fourth bit line high, the drain of the first PMOS transistor is asserted high relative to the drain of the second PMOS transistor. In some cases, a differential output is available from the bit cell with one side of the differential output being driven by the drain of the first PMOS transistor and the other side of the differential output being driven by the drain of the second PMOS transistor.

Other embodiments of the present invention provide memory cells that include at least one bit cell and a read port. The bit cell includes two PMOS transistors, two NMOS transistors, and two inverters. The source of the first PMOS transistor is electrically coupled to a first bit line, the source of the second PMOS transistor is electrically coupled to a second bit line, the source of the first NMOS transistor is electrically coupled to a third bit line, and the source of the second NMOS transistor is electrically coupled to a fourth bit line. The gate of the first NMOS transistor and the gate of the second NMOS transistor are electrically coupled to a word line input. The gate of the first PMOS transistor and the gate of the second PMOS transistor are electrically coupled to an inverted version of the word line input. The drain of the first PMOS transistor is electrically coupled to the drain of the first NMOS transistor, and the drain of the second PMOS transistor is electrically coupled to the drain of the second NMOS transistor. In addition, the drain of the first PMOS transistor is electrically coupled to the drain of the second PMOS transistor by the first inverter, and the drain of the second PMOS transistor is electrically coupled to the drain of the first PMOS transistor by the second inverter. The first bit line and the third bit line are provided as an input to the read port, and the read port provides an output based on an assertion level of the first bit line and the third bit line. In some instances of the aforementioned embodiments, the read port is a sense circuit.

In some instances of the aforementioned embodiments, the memory device includes another read port that is implemented as a sense circuit. In such embodiments, the second bit line and the third bit line are provided as an input to the additional read port, and the additional read port provides another output based on an assertion level of the second bit line and the fourth bit line. In various instances of the aforementioned embodiments, both of the read ports are simultaneously readable. Further, in various instances of the aforementioned embodiments, the four bit lines are re-used for both read and write accesses to the bit cell. In some cases, the memory device further includes isolation circuitry that is capable of isolating the four bit lines from a write data input during read accesses to the bit cell, and isolates the four bit lines from a load perceived by the read port(s) during write accesses to the bit cell.

Yet other embodiments of the present invention provide memory devices that include a bit cell and a read port. The bit cell includes two PMOS transistors, two NMOS transistors, and two inverters. The source of the first PMOS transistor and the source of the first NMOS transistor are electrically coupled to a first bit line, and the source of the second PMOS transistor and the source of the second NMOS transistor are electrically coupled to a second bit line. The gate of the first PMOS transistor and the gate of the second PMOS transistor are electrically coupled to the inverted version of the word line input, and the gate of the first NMOS transistor and the gate of the second NMOS transistor are electrically coupled to the word line input. The drain of the first PMOS transistor is electrically coupled to the drain of the first NMOS transistor, and the drain of the second PMOS transistor is electrically coupled to the drain of the second NMOS transistor. Further, the drain of the first PMOS transistor is electrically coupled to the drain of the second PMOS transistor via the first inverter, and the drain of the second PMOS transistor is electrically coupled to the drain of the first PMOS transistor via the second inverter. The first bit line and the second bit line are provided as an input to the read port, and the read port provides an output based on a difference between the first bit line and the second bit line.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to data storage circuits, and more particularly to Sub-threshold memory devices.

Figure 1:
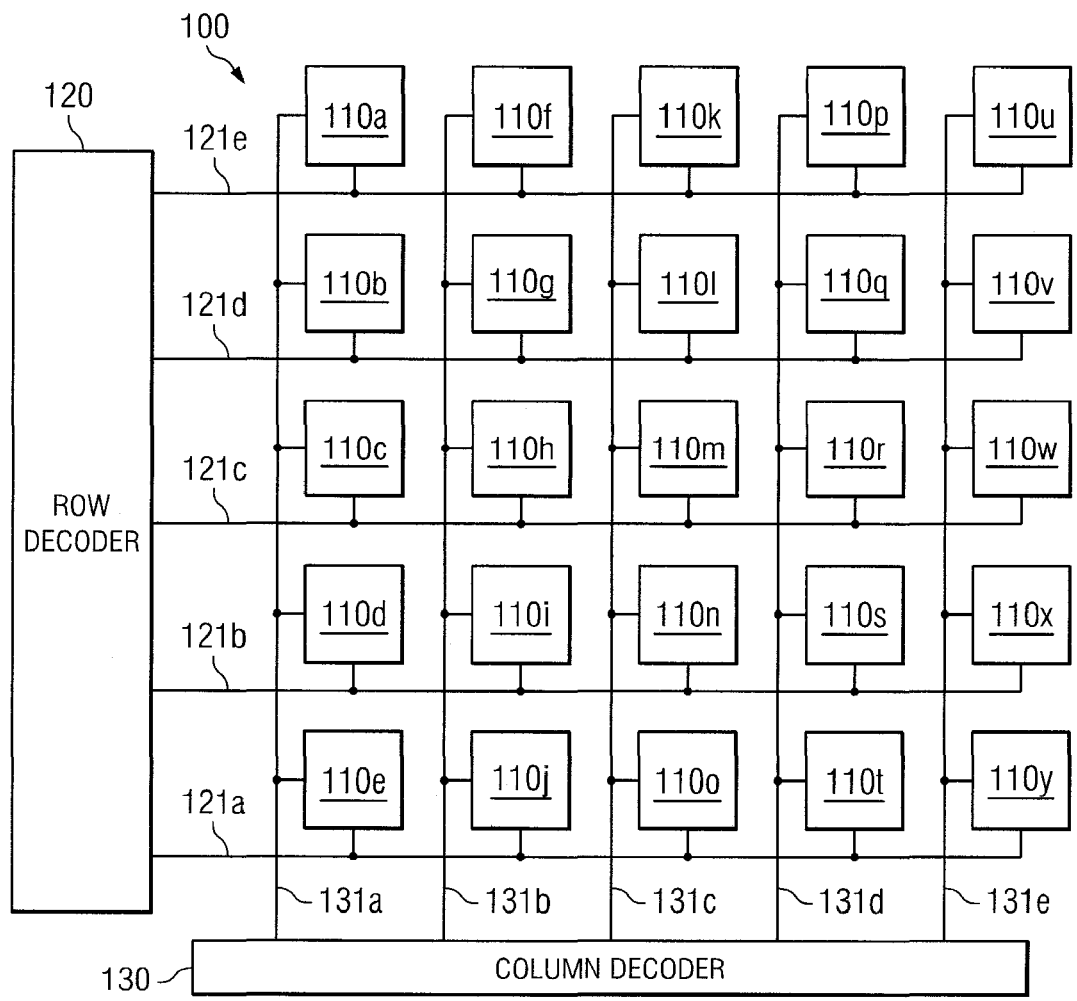
FIG. 1 depicts a prior art memory array.
Figure 2:
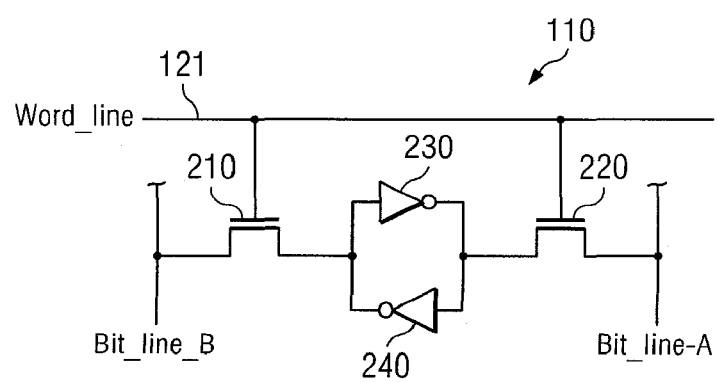
FIG. 2 shows a prior art memory bit cell.
Figure 3:
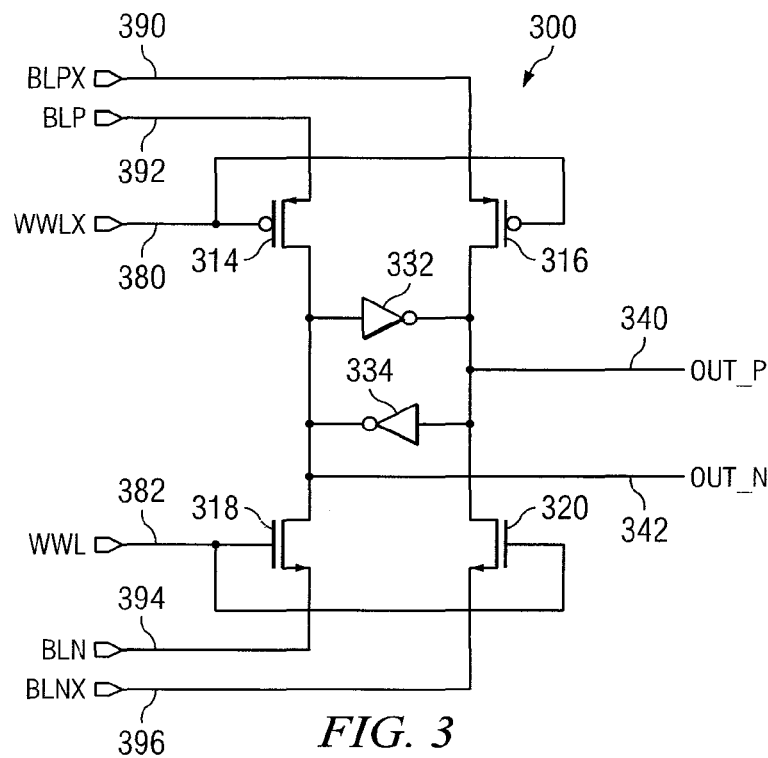
FIG. 3 shows a differential memory bit cell in accordance with one or more embodiments of the present invention.

Turning to FIG. 3, a bit cell 300 including a differential jam latch is shown in accordance with various embodiments of the present invention. Bit cell 300 includes a bit line input comprised of four input bit lines 390 (BLPX), 392 (BLP), 394 (BLN), 396 (BLNX), and two word lines 380 (WWLX), 382 (WWL). Bit cell 300 further includes a positive output 340 (OUT_P) and a negative output 342 (OUT_N). The core of bit cell 300 includes a group of PMOS transistors 314, 316, and a group of NMOS transistors 318, 320. In particular, the source of PMOS transistor 314 is electrically coupled to bit line 392, and the source of PMOS transistor 316 is electrically coupled to bit line 390. The gate of PMOS transistor 314 and the gate of PMOS transistor 316 are electrically coupled to word line 380. The drain of PMOS transistor 314 is electrically coupled to the drain of NMOS transistor 318, and the drain of PMOS transistor 316 is electrically coupled to the drain of NMOS transistor 320. Further, the drain of PMOS transistor 314 is electrically coupled to the drain of PMOS transistor 316 via a set of inverters 332, 334. In particular, inverter 332 receives the signal at the drain of PMOS transistor 314, inverts the signal, and drives the inverted signal onto the drain of PMOS transistor 316. Similarly, inverter 334 receives the signal at the drain of PMOS transistor 316, inverts the signal, and drives the inverted signal onto the drain of PMOS transistor 314. In addition, the signal at the drain of PMOS transistor 316 drives positive output 340, and the signal at the drain of PMOS transistor 314 drives negative output 342. The gate of NMOS transistor 318 and the gate of NMOS transistor 320 are electrically coupled to word line 382. The source of NMOS transistor 318 is electrically coupled to bit line 394, and the source of NMOS transistor 320 is electrically coupled to bit line 396.

In operation, writing bit cell 300 includes asserting word line 382 high (i.e., at a logic '1'), and asserting word line 380 low (i.e., at a logic '0'). With word line 382 asserted high and word line 380 asserted low, transistors 314, 316, 318, 320 are all conductive. With the transistors conductive, bit cell 300 may be written with a value reflecting the assertion levels of bit lines 390, 392, 394, 396. In particular, to write bit cell 300 such that a logic '1' is provided at positive output 340, bit lines 390, 392, 394, 396 are asserted in accordance with that set forth in Table 1.

TABLE 1

| Bit Line | Assertion Level |
| --- | --- |
| Bit Line 390 (BLPX) | HIGH (logic '1') |
| Bit Line 392 (BLP) | LOW (logic '0') |
| Bit Line 394 (BLN) | LOW (logic '0') |
| Bit Line 396 (BLNX) | HIGH (logic '1') |

In contrast, to write bit cell 300 such that a logic '0' is provided at positive output 340, bit lines 390, 392, 394, 396 are asserted in accordance with that set forth in Table 2.

TABLE 2

| Bit Line | Assertion Level |
| --- | --- |
| Bit Line 390 (BLPX) | LOW (logic '0') |
| Bit Line 392 (BLP) | HIGH (logic '1') |
| Bit Line 394 (BLN) | HIGH (logic '1') |
| Bit Line 396 (BLNX) | LOW (logic '0') |

By providing four distinct bit lines 390, 392, 394, 396 external to bit cell 300, differential operation is enabled. Further, where a differential output is provided that can be applied to a sense circuit, the aforementioned differential operation is increased. Such differential operation supports accurate read and write operations even where the voltage offered by a power supply is decreased in comparison to other existing bit cell technologies. This decrease in the required voltage in some cases does not come with a corresponding decrease in bandwidth. Further, by utilizing both PMOS and NMOS transistors, bit cell 300 is less susceptible to process and environmental variations when compared with existing bit cell technologies. In some cases, providing four distinct bit lines 390, 392, 394, 396 external to bit cell 300 reduces the density of a memory device based on such a bit cell when compared with existing technologies. However, the potential voltage reduction may allow for process variations that would mitigate the decrease in density.

Figure 4:
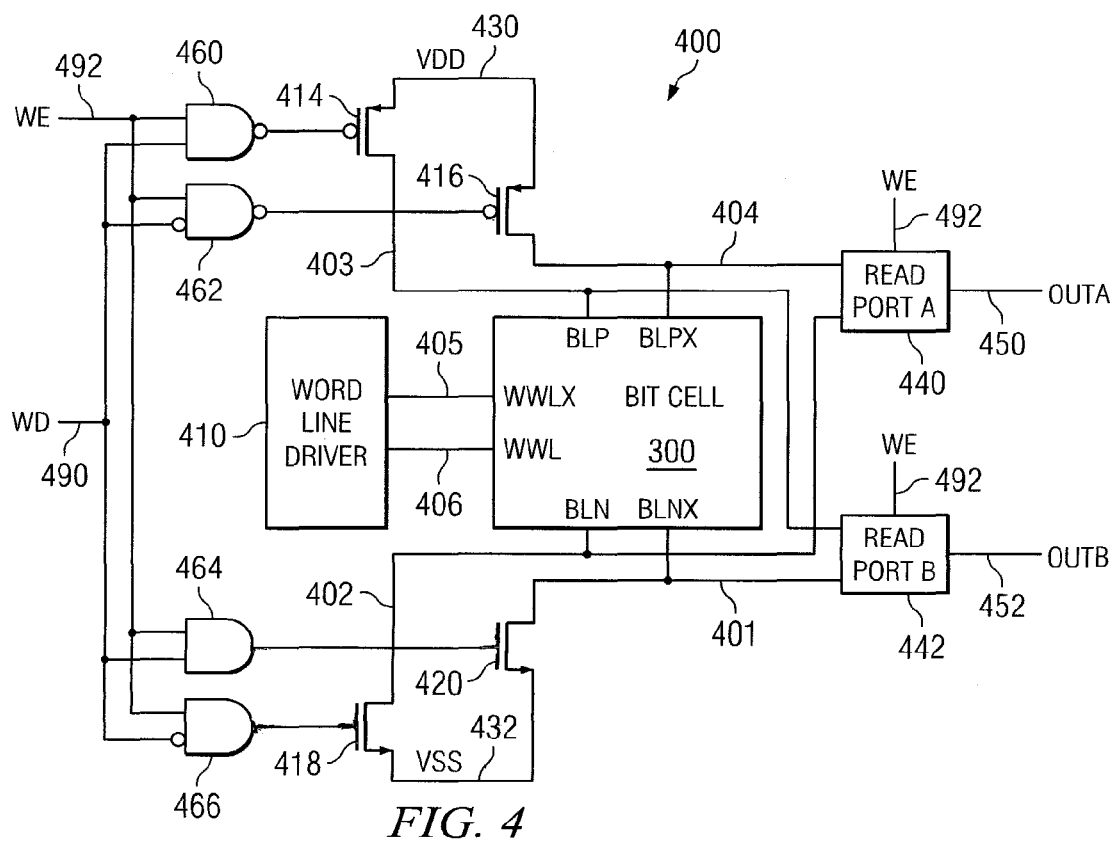
FIG. 4 depicts a single bit of a memory array utilizing the differential memory bit cell of FIG. 3 in accordance with various embodiments of the present invention.

Turning to FIG. 4, a single bit memory array 400 based on bit cell 300 is depicted in accordance with various embodiments of the present invention. Memory array 400 includes two PMOS transistors 414, 416, and two NMOS transistors 418, 420 that together operate to gate four bit lines 401 (BLN), 402 (BLNX), 403 (BLP) and 404 (BLPX) during reads from bit cell 300. Further, the aforementioned transistors drive the four bit lines during a write to bit cell 300. Memory array 400 further includes a word line driver 410 that causes a word line 406 (WWL) to assert high and a word line 405 (WWLX) to assert low during either a read or a write access to bit cell 300. At other times, word line driver 410 causes word line 406 to assert low and word line 405 to assert high. Based on the disclosure provided herein, one of ordinary skill in the art will recognize a variety of implementations that are possible for word line driver 410 in accordance with the various embodiments of the present invention. The gates of PMOS transistors 414, 416 and NMOS transistors 418, 420 are driven by a write enable input 492 and a write data input 490 as combined by gates 460, 462, 464, 466.

Memory array 400 further includes two read ports 440, 442. Read port 440 may be any sense circuit known in the art that is capable of receiving a double ended input and providing single ended output 450 representing the double ended input. In this case, the double ended input includes a bit line 404 (BLPX) and a bit line 402 (BLN). It should be noted that BLPX is driven by a PMOS transistor of bit cell 300 and BLN is driven by an NMOS transistor of bit cell 300. In a typical scenario, both bit line 404 and bit line 402 are asserted at the same logic level. As PMOS transistors more easily sense a logic '1' and an NMOS transistor more easily sense a logic '0', by providing the aforementioned double ended input with one end from an NMOS transistor and the other end from a PMOS transistor, a more accurate read is achievable via read port 440. Similarly, read port 442 may be any sense circuit known in the art that is capable of receiving a double ended input and providing single ended output 452 representing the double ended input. In this case, the double ended input includes a bit line 403 (BLP) and a bit line 401 (BLNX). Again, it should be noted that BLP is driven by a PMOS transistor of bit cell 300 and BLNX is driven by an NMOS transistor of bit cell 300 resulting in a more accurate read. Read ports 440, 442 may be disabled when a read is not being performed by asserting a write enable input 492 low. By doing this, read ports 440, 442 do not load bit lines 401, 402, 403, 404 during a write operation to bit cell 300.

During a write of bit cell 300, write enable input 492 is asserted high. This isolates bit lines 401, 402, 403, 404 from any load seen by read ports 440, 442. When a write data input 490 is asserted high, bit line 401 is asserted low, bit line 402 is asserted floating, bit line 403 is asserted high, and bit line 404 is floating. This results in a logic '1' being stored in bit cell 300. In contrast, when write data input 490 is asserted low, bit line 401 is floating, bit line 402 is asserted low, bit line 403 is floating, and bit line 404 is asserted high. This results in a logic '0' being stored in bit cell 300.

During a read of bit cell 300, write enable input 492 is asserted low. This causes each of PMOS transistors 414, 416 and NMOS transistors 418, 420 to turn off. By turning the aforementioned transistors off, bit lines 401, 402, 403, 404 are isolated from write data input 490. When a logic '0' is stored in bit cell 300, bit line 401 is asserted low, bit line 402 is asserted high, bit line 403 is asserted high, and bit line 404 is asserted low. The differential input provided to read port 440 includes two low asserted inputs, and single ended output 450 is asserted low. The differential input provided to read port 442 are both asserted high, and single ended output 452 is asserted low.

In contrast, When a logic '1' is stored in bit cell 300, bit line 401 is asserted high, bit line 402 is asserted low, bit line 403 is asserted low, and bit line 404 is asserted high. The differential input provided to read port 440 includes two high asserted inputs, and single ended output 450 is asserted high. The differential input provided to read port 442 are both asserted low, and single ended output 452 is asserted high. It should be noted that bit lines 401, 402, 403, 404 are used for both reads and writes. Further, it should be noted that bit cell 300 may be read from either port 440 or port 442 at the same time or at different times.

It should be noted that while memory array 400 includes a single bit, a memory array including any number of bits and/or word widths may be implemented in accordance with one or more embodiments of the present invention. Such multi-bit memory arrays may be created by replicating bit cell 300 and re-using word line driver 410 for a number of bit cells arranged in the same word. Based on the disclosure provided herein, one of ordinary skill in the art will recognize a variety of modifications that may be made in implementing single or multi-bit memory devices in accordance with various embodiments of the present invention.

Figure 5:
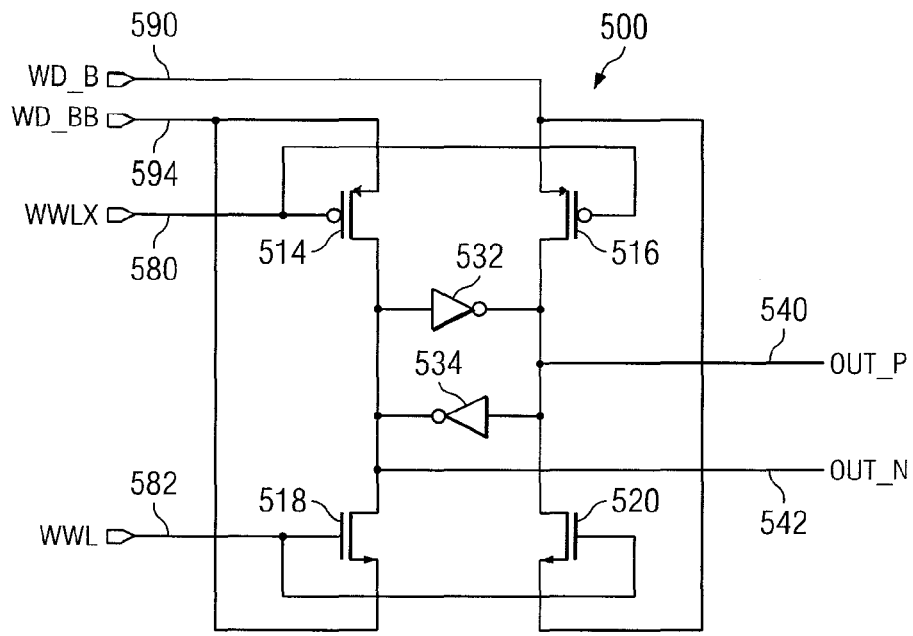
FIG. 5 shows another differential memory bit cell in accordance with other embodiments of the present invention.

Turning to FIG. 5, another bit cell 500 including a differential jam latch is shown in accordance with various other embodiments of the present invention. Bit cell 500 includes only two bit lines 590 (WD_B), 594 (WD_BB), and two word lines 580 (WWLX), 582 (WWL). Bit cell 300 further includes a positive output 540 (OUT_P) and a negative output 542 (OUT_N). The core of bit cell 500 includes a group of PMOS transistors 514, 516; and a group of NMOS transistors 518, 520. In particular, the source of PMOS transistor 514 is electrically coupled to bit line 594, and the source of PMOS transistor 516 is electrically coupled to bit line 590. The gate of PMOS transistor 514 and the gate of PMOS transistor 516 are electrically coupled to word line 580. The drain of PMOS transistor 514 is electrically coupled to the drain of NMOS transistor 518, and the drain of PMOS transistor 516 is electrically coupled to the drain of NMOS transistor 520. Further, the drain of PMOS transistor 514 is electrically coupled to the drain of PMOS transistor 516 via a set of inverters 532, 534. In particular, inverter 532 receives the signal at the drain of PMOS transistor 514, inverts the signal, and drives the inverted signal onto the drain of PMOS transistor 516. Similarly, inverter 534 receives the signal at the drain of PMOS transistor 516, inverts the signal, and drives the inverted signal onto the drain of PMOS transistor 514. In addition, the signal at the drain of PMOS transistor 516 drives positive output 540, and the signal at the drain of PMOS transistor 514 is drives negative output 342. The gate of NMOS transistor 518 and the gate of NMOS transistor 520 are electrically coupled to word line 582. The source of NMOS transistor 518 is electrically coupled to bit line 594, and the source of NMOS transistor 520 is electrically coupled to bit line 590.

In operation, writing bit cell 500 includes asserting word line 582 high (i.e., at a logic '1'), and asserting word line 580 low (i.e., at a logic '0'). With word line 582 asserted high and word line 580 asserted low, transistors 514, 516, 518, 520 are all conductive. With the transistors conductive, bit cell 500 may be written with a value reflecting the assertion levels of bit lines 590, 594. In particular, to write bit cell 500 such that a logic '1' is provided at positive output 540, bit lines 590, 594 are asserted in accordance with that set forth in Table 3.

TABLE 3

| Bit Line | Assertion Level |
| --- | --- |
| Bit Line 590 (WD_B) | HIGH (logic '1') |
| Bit Line 594 (WD_BB) | LOW (logic '0') |

In contrast, to write bit cell 500 such that a logic '0' is provided at positive output 540, bit lines 590, 594 are asserted in accordance with that set forth in Table 4.

TABLE 4

| Bit Line | Assertion Level |
| --- | --- |
| Bit Line 590 (WD_B) | LOW (logic '0') |
| Bit Line 594 (WD_BB) | HIGH (logic '1') |

By providing two distinct bit lines 590, 594 external to bit cell 500, differential operation of bit cell 500 is maintained while requiring only two external bit lines compared with the four external bit lines of bit cell 300. Where a differential output is provided that can be applied to a sense circuit, the aforementioned differential operation is increased. Such differential operation supports accurate read and write operations even where the voltage offered by a power supply is decreased in comparison to other existing bit cell technologies. This decrease in the required voltage in some cases does not come with a corresponding decrease in bandwidth. Further, by utilizing both PMOS and NMOS transistors, bit cell 500 is less susceptible to process and environmental variations when compared with existing bit cell technologies.

Figure 6:
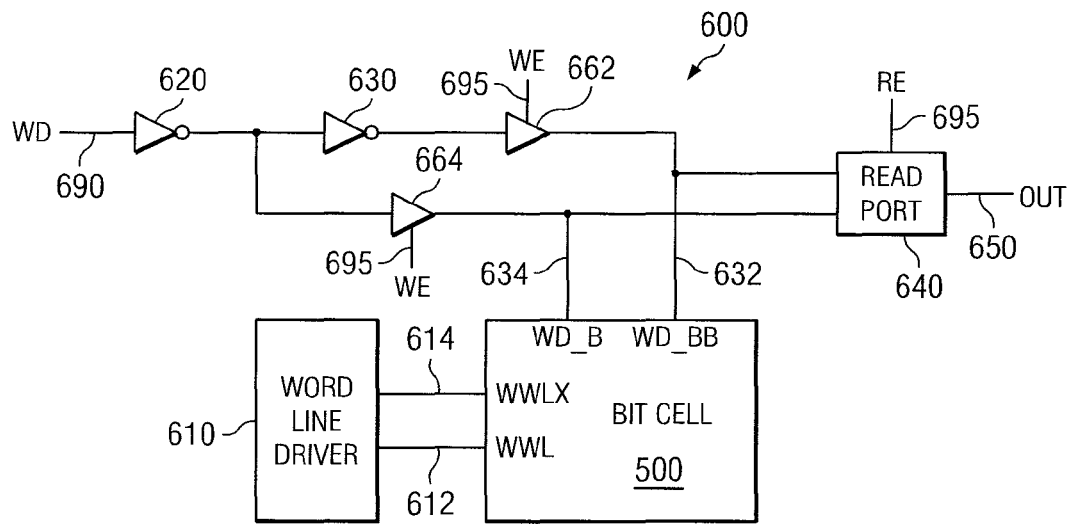
FIG. 6 depicts a single bit of a memory array utilizing the differential memory bit cell of FIG. 5 in accordance with various embodiments of the present invention.

Turning to FIG. 6, a single bit memory array 600 based on bit cell 500 is depicted in accordance with various embodiments of the present invention. Memory array 600 includes two inverters 620, 630, a tri-state buffer 662, a tri-state buffer 664, and a word line driver 610 that are used to access bit cell 500. In addition, memory array 600 includes a read port 640. Read port 640 may be any sense circuit known in the art that is capable of receiving a differential input and providing single ended output 650 representing the differential input.

In operation, whenever a read or a write is to be performed, word line driver 610 asserts a word line 612 (WWL) high, and a word line 614 (WWLX) low to enable access to bit cell 500 via a bit line 632 (WD_BB) and a bit line 634 (WD_B). When a read is being performed, a read enable signal 695 is asserted low. This allows write data 690 to be presented on bit line 634 via inverter 620, and onto bit line 632 via both inverter 620 and inverter 630. During this process, read port 640 is disabled to avoid loading bit lines 632, 634. In contrast, when a read is being performed, read enable signal 695 is asserted high. This causes tri-state buffer 662 and tri-state buffer 664 to isolate bit lines 632, 634 from write data 690. With the read enable signal asserted high, read port 640 senses the differential output signal comprising bit line 632 and bit line 634, and drives single ended output 650 to a level reflecting the input differential signal.

It should be noted that while memory array 600 includes a single bit, a memory array including any number of bits and/or word widths may be implemented in accordance with one or more embodiments of the present invention. Such multi-bit memory arrays may be created by replicating bit cell 500 and re-using word line driver 610 for a number of bit cells arranged in the same word. Based on the disclosure provided herein, one of ordinary skill in the art will recognize a variety of modifications that may be made in implementing single or multi-bit memory devices in accordance with various embodiments of the present invention.

Figure 7:
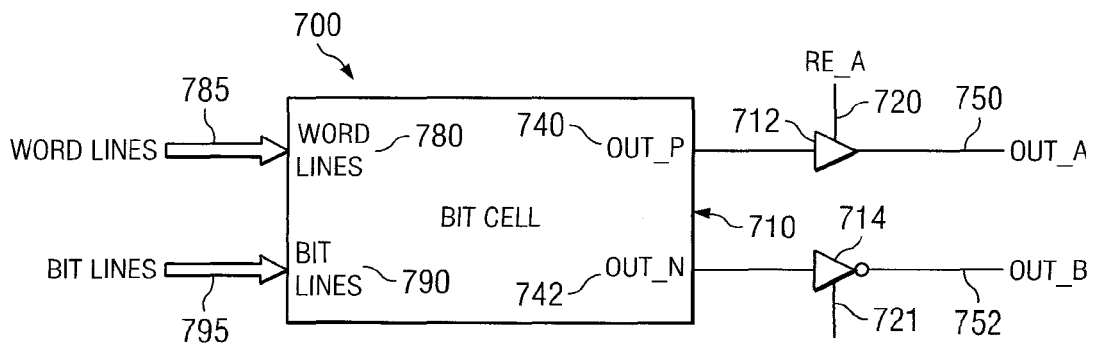
FIG. 7 depicts a single bit register utilizing the differential memory bit cell of either FIG. 3 or FIG. 5 in accordance with various embodiments of the present invention.

Turning to FIG. 7, a single bit register 700 utilizing a differential memory bit cell in accordance with various embodiments of the present invention is depicted. Register 700 includes a bit cell 710. Bit cell 710 includes a differential word line input 780 and a differential bit line input 790. Differential word line input 780 is driven by word lines 785, and differential bit line input 790 is driven by bit lines 795. In addition, bit cell 710 includes a positive output 740 and a negative output 742. Positive output 740 drives a non-inverting tri-state buffer 712 that in turn drives a register output 750. Negative output 742 drives an inverting tri-state buffer 714 that in turn drives a register output 752. In operation, a tri-state input (RE_A) 720 is asserted such that non-inverting tri-state buffer 712 is tri-stated whenever bit cell 710 is being written. Similarly, a tri-state input (RE_B) 721 is asserted such that inverting tri-state buffer 714 is tri-stated whenever bit cell 710 is being written. This avoids excess loading on bit cell 710 when it is being written. In contrast, tri-state input 720 is asserted such that non-inverting tri-state buffer 712 is not tri-stated when register output 750 is to be read. Similarly, tri-state input 721 is asserted such that inverting tri-state buffer 712 is not tri-stated when register output 752 is to be read. This makes the contents of bit cell 710 available at register output 750 and/or register output 752 during a read operation.

It should be noted that a single ended output may be implemented by eliminating either register output 750 and non-inverting tri-state buffer 712 or eliminating register output 752 and inverting tri-state buffer 714. As another alternative, a single ended output may be implemented by applying positive output 740 and negative output 742 to a sense circuit, and applying the output of the sense circuit to a tri-state buffer that in turn drives the single ended output. Based on the disclosure provided herein, one of ordinary skill in the art will recognize other approaches that may be utilized to implemented a single ended output register in accordance with one or more embodiments of the present invention.

Bit cell 710 may be implemented as either bit cell 300 discussed above in relation to FIG. 3 or bit cell 500 discussed above in relation to FIG. 5. Where bit cell 710 is implemented with four bit lines consistent with bit cell 300, bit lines 795 would include the four bit lines of bit cell 300 and word lines 785 would include the two word lines of bit cell 300. Similarly, where bit cell 710 is implemented with two bit lines consistent with bit cell 500, bit lines 795 would include the two bit lines of bit cell 500 and word lines 785 would include the two word lines of bit cell 500.

It should be noted that while register 700 includes a single bit, a register including any number of bits may be implemented in accordance with one or more embodiments of the present invention. Such multi-bit registers may be created by replicating bit cell 710 and tri-state buffers 712, 714 for each bit of the multi-bit register. Based on the disclosure provided herein, one of ordinary skill in the art will recognize a variety of modifications that may be made in implementing single or multi-bit registers in accordance with various embodiments of the present invention.

In conclusion, the present invention provides novel systems, devices, methods for data storage. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A sub-threshold memory device, the memory device comprising:
    a bit cell, wherein the bit cell includes:
        a bit line input;
        a word line input;
        a first PMOS transistor having a gate, a source and a drain, wherein the source of the first PMOS transistor is electrically coupled to the bit line input, and wherein the gate of the first PMOS transistor is electrically coupled to the word line input;
        a second PMOS transistor having a gate, a source and a drain, wherein the source of the second PMOS transistor is electrically coupled to the bit line input, and wherein the gate of the second PMOS transistor is coupled to the word line input, and wherein the drain of the second PMOS transistor is electrically coupled to the drain of the first PMOS transistor;
        a first NMOS transistor having a gate, a source and a drain, wherein the source of the first NMOS transistor is electrically coupled to the bit line input, and wherein the gate of the first NMOS transistor is electrically coupled to the word line input;
        a second NMOS transistor having a gate, a source and a drain, wherein the source of the second NMOS transistor is electrically coupled to the bit line input, and wherein the gate of the second NMOS transistor is electrically coupled to the word line input, and wherein the drain of second NMOS transistor is electrically coupled to the drain of the first NMOS transistor;
        a first inverter, wherein the drain of the first PMOS transistor is electrically coupled to the drain of the second PMOS transistor through the first inverter;
        a second inverter, wherein the drain of the first NMOS transistor is electrically coupled to the drain of the second NMOS transistor through the second inverter;
    a word line driver that is electrically coupled to the word line input; and
    a read port that is electrically coupled to the drains of the first PMOS transistor, the second PMOS transistor, the first NMOS transistor, and the second NMOS transistor, wherein the read port receives a read enable signal that indicates when the bit cell is being written, and wherein the read port further comprises:
        a first tri-state buffer that is coupled to the drains of the first NMOS transistor and the first PMOS transistor, wherein the first tri-state buffer is adapted to receive the read enable signal; and
        a second tri-state buffer that is coupled to the drains of the second NMOS transistor and the second PMOS transistor, wherein the second tri-state buffer is adapted to receive the read enable signal.

2. The memory device of claim 1, wherein the bit line input further comprises:
    a first bit line input that is coupled to the sources of the first PMOS transistor and the first NMOS transistor; and
    a second bit line input that is coupled to the sources of the second PMOS transistor and the second NMOS transistor.

3. The memory device of claim 1, wherein the word line input further comprises:
    a first word line input that is coupled to the gates of the first and second PMOS transistors; and
    a second word line input that is coupled to the gates of the first and second NMOS transistors.

* * * * *